(12) United States Patent
Zang et al.

(10) Patent No.: US 10,522,639 B2
(45) Date of Patent: Dec. 31, 2019

(54) METHODS, APPARATUS AND SYSTEM FOR STRINGER DEFECT REDUCTION IN A TRENCH CUT REGION OF A FINFET DEVICE

(71) Applicant: GLOBALFOUNDRIES INC., Grand Cayman (KY)

(72) Inventors: Hui Zang, Guilderland, NY (US); Daniel Jaeger, Saratoga Springs, NY (US); Haigou Huang, Rexford, NY (US); Veeraraghavan Basker, Albany, NY (US); Christopher Nassar, Ballston Spa, NY (US); Jinsheng Gao, Clifton Park, NY (US); Michael Aquilino, Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/458,056

(22) Filed: Jun. 29, 2019

(65) Prior Publication Data
US 2019/0326408 A1    Oct. 24, 2019

Related U.S. Application Data

(62) Division of application No. 15/716,287, filed on Sep. 26, 2017.

(51) Int. Cl.
*H01L 29/49*    (2006.01)
*H01L 21/8234*    (2006.01)
(Continued)

(52) U.S. Cl.
CPC .... *H01L 29/4933* (2013.01); *H01L 21/02425* (2013.01); *H01L 21/2257* (2013.01);
(Continued)

(58) Field of Classification Search
CPC ........... H01L 29/4933; H01L 21/02425; H01L 21/2257
See application file for complete search history.

(56) References Cited

U.S. PATENT DOCUMENTS 9,390,979 B2    7/2016  Wei et al.
9,818,875 B1    11/2017  Bi et al.
(Continued)

OTHER PUBLICATIONS

Non-Final Office Action dated Mar. 14, 2019; Co-pending U.S. Appl. No. 15/716,287.

*Primary Examiner* — Marc Anthony Armand
(74) *Attorney, Agent, or Firm* — Williams Morgan, P.C.

(57) ABSTRACT

At least one method, apparatus and system disclosed herein involves forming trench in a gate region, wherein the trench having an oxide layer to a height to reduce or prevent process residue. A plurality of fins are formed on a semiconductor substrate. Over a first portion of the fins, an epitaxial (EPI) feature at a top portion of each fin of the first portion. Over a second portion of the fins, a gate region is formed. In a portion of the gate region, a trench is formed. A first oxide layer at a bottom region of the trench is formed. Prior to performing an amorphous-silicon (a-Si) deposition, a flowable oxide material is deposited into the trench for forming a second oxide layer. The second oxide layer comprises the flowable oxide and the first oxide layer. The second oxide layer has a first height.

12 Claims, 7 Drawing Sheets

(51) Int. Cl.
  *H01L 29/78*     (2006.01)
  *H01L 29/66*     (2006.01)
  *H01L 21/02*     (2006.01)
  *H01L 21/28*     (2006.01)
  *H01L 21/225*    (2006.01)
  *H01L 21/321*    (2006.01)
  *H01L 27/092*    (2006.01)
  *H01L 29/417*    (2006.01)
  *H01L 21/8238*   (2006.01)

(52) U.S. Cl.
  CPC .... *H01L 21/28052* (2013.01); *H01L 21/3212* (2013.01); *H01L 21/823431* (2013.01); *H01L 21/823821* (2013.01); *H01L 27/0924* (2013.01); *H01L 29/41791* (2013.01); *H01L 29/66795* (2013.01); *H01L 29/785* (2013.01)

(56) References Cited

U.S. PATENT DOCUMENTS

2018/0090493 A1* 3/2018 Kwak ............... H01L 29/66795
2019/0027473 A1   1/2019 Chen et al.

\* cited by examiner

METHODS, APPARATUS AND SYSTEM FOR STRINGER DEFECT REDUCTION IN A TRENCH CUT REGION OF A FINFET DEVICE

BACKGROUND OF THE INVENTION

Field of the Invention

Generally, the present disclosure relates to the manufacture of sophisticated semiconductor devices, and more specifically, to using flowable oxide in a fin cut region for reducing stringer defects.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

Using one of various techniques, a plurality of fins are formed on substrate. A plurality of layers of materials that may be deposited on the fins. Some of the fins are designated to be source or drain fins, while a gate area is formed above the fins between the source and drain regions. In the gate area, dummy gate region are formed over the fins. In a predetermined location, a trench silicide (TS) region formed between portions of the dummy gate region. As dimensions in finFET devices become smaller, performing state-of-the-art trench cut processes subsequent to forming trench silicide contact features may result in residue in the trench regions, which may result in device operations problems.

Designers often designate a TS cut region to form a TS region. Often, due to poly gate material and/or amorphous silicon (a-Si) that are deposited for forming gate regions, residue from these material(s) may remain in the bottom regions of the trench. This residue may cause various problems. For example, the residue or "stringer" material, may cause various current leakage, reduced FET to FET isolation, and/or parasitic capacitance problems. These problems in state-of-the-art processes may case device performance problems and/or increased defects during device manufacturing, negatively affecting manufacturing yields.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a trench in a gate region, wherein the trench having an oxide layer to a height to reduce or prevent process residue. A plurality of fins are formed on a semiconductor substrate. Over a first portion of the fins, an epitaxial (EPI) feature at a top portion of each fin of the first portion. Over a second portion of the fins, a gate region is formed. In a portion of the gate region, a trench is formed. A first oxide layer at a bottom region of the trench is formed. Prior to performing an amorphous-silicon (a-Si) deposition, a flowable oxide material is deposited into the trench for forming a second oxide layer. The second oxide layer comprises the flowable oxide and the first oxide layer. The second oxide layer has a first height.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming a gate region for a finFET device, performing a trench (e.g., a shallow isolation (STI) cut process in the gate region, and depositing flowable dielectric material (e.g., flowable oxide) into the bottom of the STI trench formed by the STI trench cut process. The trench cut process may be performed to form a TS region. A poly gate material (e.g., polysilicon) deposition process then may be performed, and the presence of the flowable oxide into the bottom portion of the trench may cause the flow of gate poly material into the bottom portion of the STI trench to be reduced or substantially eliminated. In embodiments herein, upon performing a poly pull process and/or an amorphous (a-Si) deposition process, substantially all of the poly gate material and/or a-Si residue are pulled out of the STI trench, leaving the flowable oxide, wherein any residue/stringers may be reduced and/or substantially eliminated. A low-k material deposition may then be performed.

Figure 1:
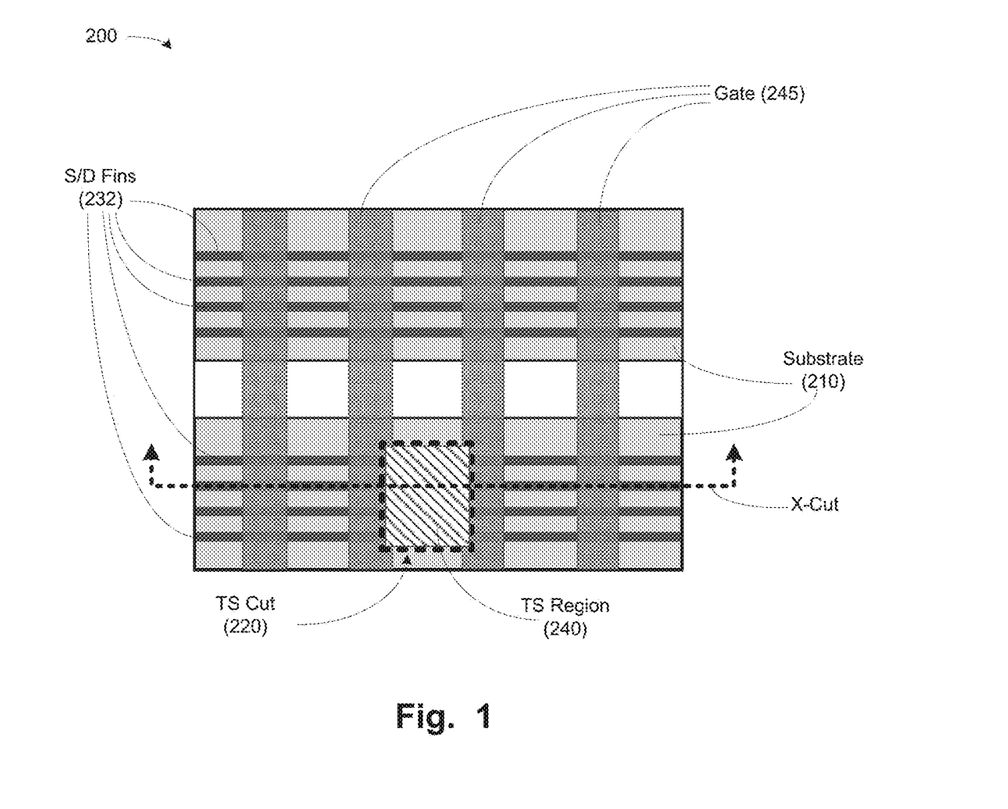
FIG. 1 illustrates a stylized, simplified plan view of a finFET device, in accordance with embodiments herein.

Turning now to FIG. 1, a stylized, simplified top view of a finFET device, in accordance with embodiments herein, is illustrated. FIG. 1 illustrates an integrated circuit device 200 comprising a plurality of fins 232 formed on a substrate 210. Further, FIG. 1 illustrates a plurality of gates formations 245. FIG. 1 also shows an a-Si formation 211 in an oxide layer. Adjacent some of the gates formations 245 are a plurality of TS cut 220, wherein a TS region 240 may be formed. The TS region 240 may eventually become source/drain contacts.

FIG. 1 also shows an X-cut line provided for reference with respect to a cross-sectional view shown in subsequent figures. FIGS. 2-9 represent stylized cross-sectional views of finFET devices with respect to the X-cut line, in accordance with exemplary embodiments herein. Those skilled in the art would appreciate that the TS region 240 is provided for exemplary and illustrative purposes and that other trench regions may be formed on the device 200.

Figure 2:
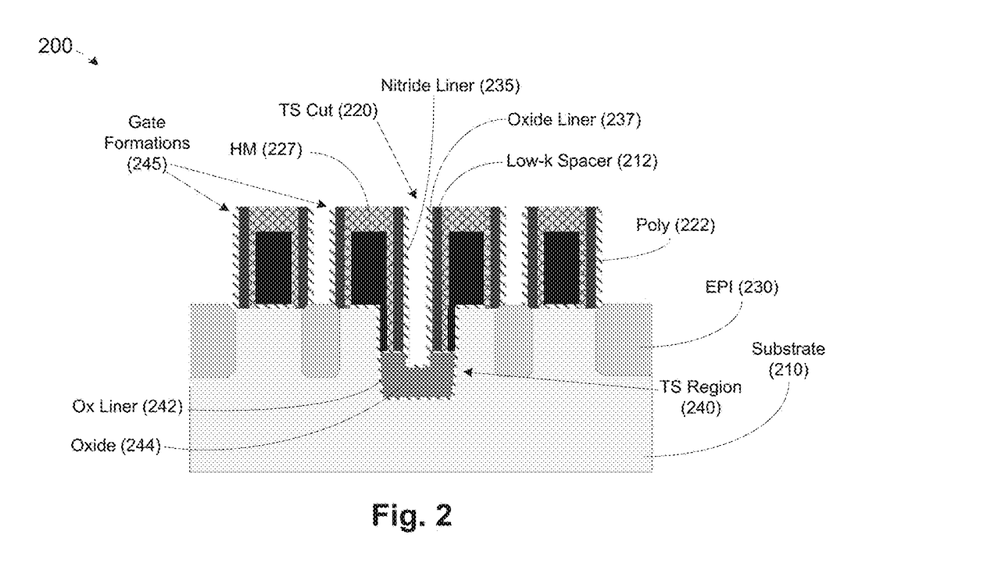
FIG. 2 illustrates a stylized depiction of a cross-sectional view across a plurality of gate regions and over fins, in accordance with embodiments herein.

FIG. 2 illustrates a stylized depiction of a cross-sectional view across a plurality of gate regions over fins, in accordance with embodiments herein. The device 200 comprises a substrate 110 on which source/drain fins 232, EPI features 230, and gate regions are formed. The gate regions comprise a plurality of gate formations 245. Each of the gate formations 245 comprises a poly gate region 222, formed from using a poly gate material (e.g., polysilicon). The poly gate region 222 (or dummy gate region) is encompassed by a nitride liner 235, a low-k spacer 212, and an oxide liner 237. A hardmask (HM) layer 227 is formed above the poly gate region 222.

Within the gate region, the TS cut region 220 may be formed to form a TS region 240. A TS cut hard mask (HM) layer 118 protects the remaining portion of the gate region when performing a TS cut process. The TS cut 220 also comprises the oxide liner 237, the nitride liner 235, and the low-k spacer 212. At the bottom portion of the TS cut region 220, an oxide liner 242 encompasses an oxide layer 244.

Figure 3:
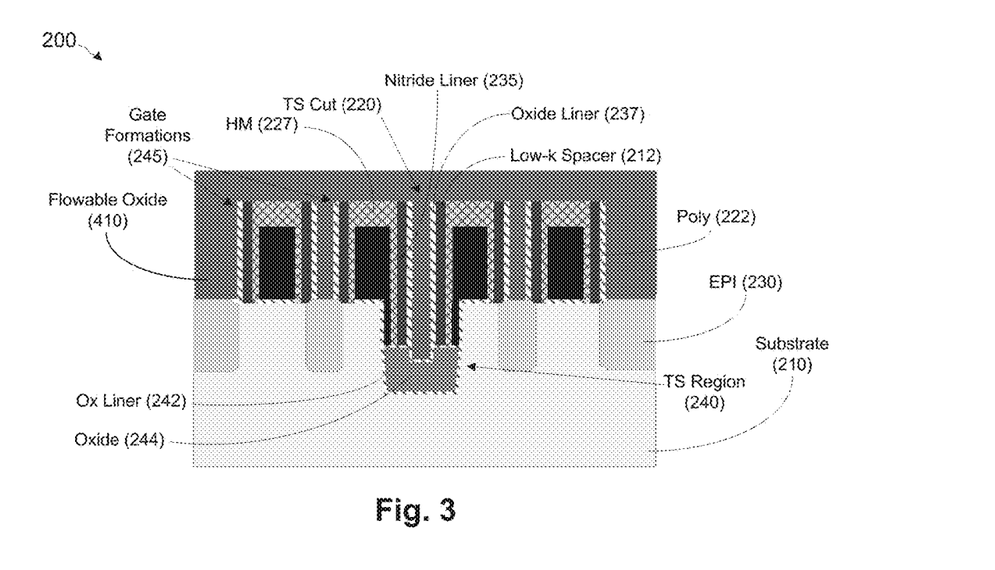
FIG. 3 illustrates a stylized depiction of a cross-sectional view of the finFET device of FIG. 3 with respect to a flowable oxide reflow process, in accordance with embodiments herein.

FIG. 3 illustrates a stylized depiction of a cross-sectional view of the finFET device 200 with respect to a flowable oxide reflow process, in accordance with embodiments herein. A process for depositing flowable oxide is performed, reflowing a flowable oxide layer 410 in the gate region. The flowable oxide deposited in the gate region flows into TS cut region 220. As such, at this stage, the TS region 244 is entirely filled with flowable oxide, in addition to the oxide layer that was already present in the bottom portion of the TS region 240.

Figure 4:
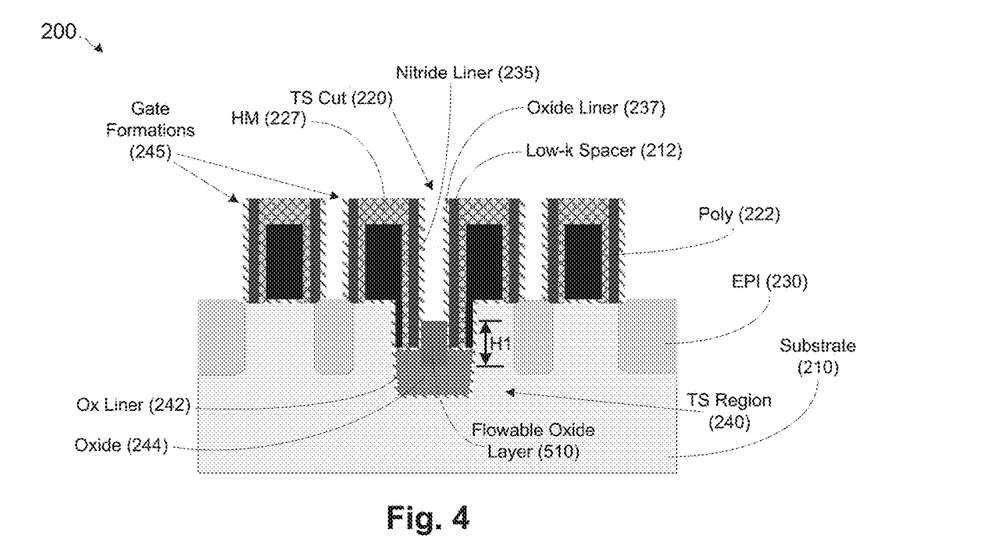
FIG. 4 illustrates a stylized depiction of a cross-sectional view of the finFET device with respect to a flowable oxide recess process, in accordance with embodiments herein.

FIG. 4 illustrates a stylized depiction of a cross-sectional view of the finFET device 200 with respect to a flowable oxide recess process, in accordance with embodiments herein. After depositing the flowable oxide into the RS region 240, the excess flowable oxide in the upper portion of the TS cut region 220 and the remaining portion of the gate region is recessed. Processes known to those skilled in the art having benefit of the present disclosure may be employed to recess the flowable oxide as desired.

After performing the flowable oxide recess process, the flowable oxide deposited into the bottom portion of the trench region of the TS cut region 220 would remain up to a predetermined height, H1, forming a flowable oxide layer 510. The height H1 is selected to provide sufficient oxide within the trench region of the TS cut region 220 to reduce or substantially eliminate any residue/stringer as a result of a poly-material and/or an a-Si deposition processes. In one embodiment, the height H1 may coincide with a predetermined level of the EPI features 230 (e.g., half-way up to the EPI features 230).

Figure 5:
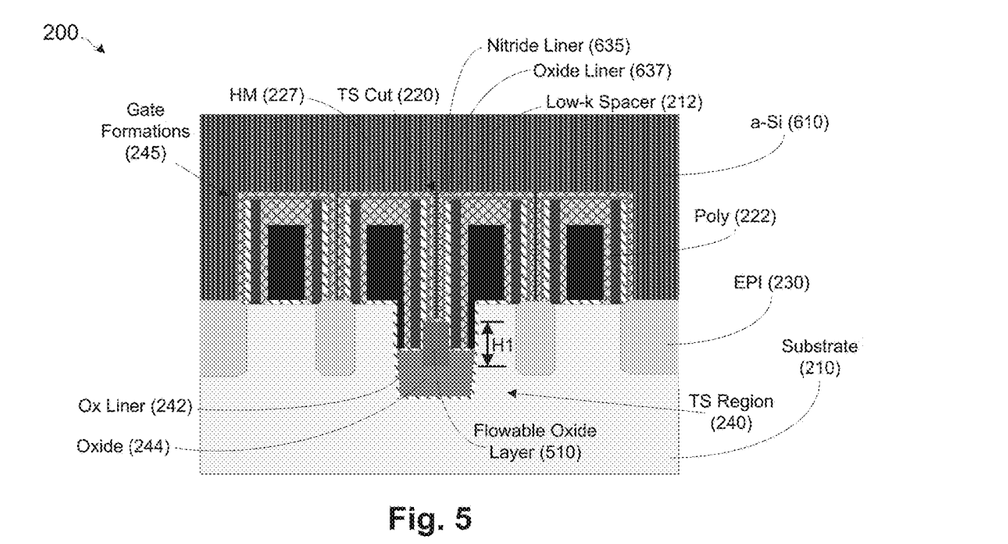
FIG. 5 illustrates a stylized depiction of a cross-sectional view of the finFET device with respect to an amorphous silicon deposition process, in accordance with embodiments herein.

FIG. 5 illustrates a stylized depiction of a cross-sectional view of the finFET device 200 with respect to an amorphous silicon deposition process, in accordance with embodiments herein. An amorphous silicon (a-Si) deposition process is performed to form an a-Si layer 610. The a-Si material is deposited into the trench region of the TS cut region 220, down to the flowable oxide layer 510. The a-Si layer 610 is also formed between the gate features 245. The a-Si layer 610 may comprised of an organic under-layer (ODL) or alternatively, a spin-on hardmask (SOH)) layer. Further, a chemical mechanical polishing (CMP) process may be performed on the a-Si layer 610, followed by an a-Si etch back process. Those skilled in the art would appreciate that various processes know to those skilled in the art may be performed, such as an anti-reflective coat (ARC) layer deposition, photoresist layer deposition, RIE process, etc., for performing replacement metal gate (RMG), and self-aligned contact (SAC) cap processes.

Figure 6:
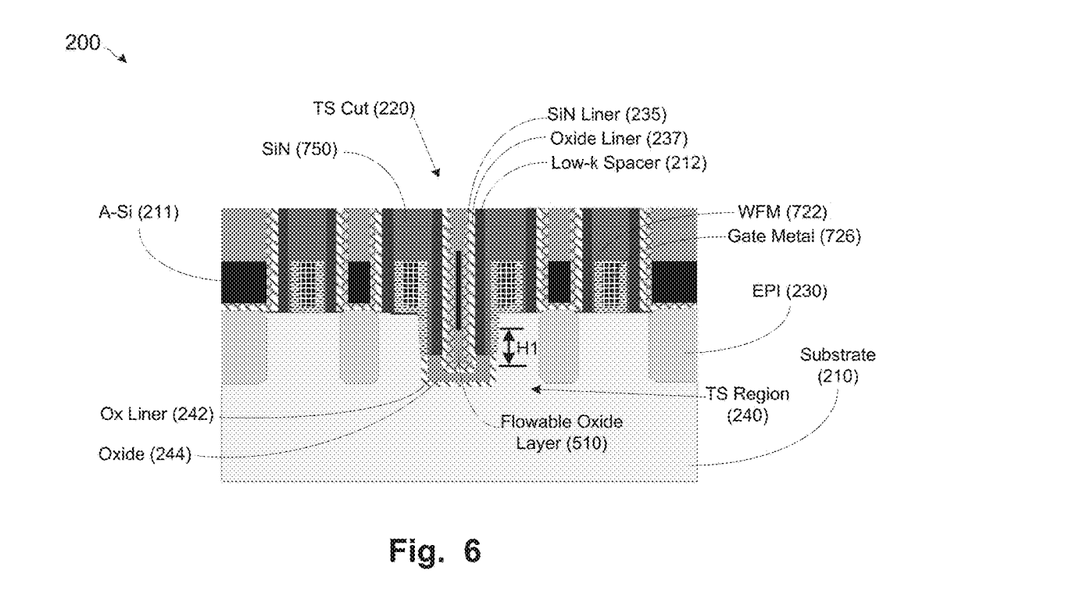
FIG. 6 illustrates a stylized cross-sectional view of the device, illustrating an aftermath of an RMG and SAC cap process, in accordance with embodiments herein.

FIG. 6 illustrates a stylized cross-sectional view of the device 200, illustrating an aftermath of an RMG and SAC cap process, in accordance with embodiments herein. The RMG process may comprise performing various steps known to those skilled having benefit of the present disclosure. For example, the RMG process may include removing the hard mask 227 and the dummy gates regions 222. The RMG process may comprise a dummy gate pull process for creating a plurality of voids for depositing gate metal. This process may include performing a poly open CMP (POC) process for exposing the dummy gate region 222. In some other embodiments, the POC process may be considered a separate step that is performed prior performing the RMG process. Further, an etch process (e.g., a poly-etch process) for removing the dummy gate material (e.g., poly-silicon material) from the dummy gate region 222 may be performed. The RMG process also includes depositing a gate metal in each of the gate features in place of the dummy gates 222. That is, the poly gate material in the dummy gate region 222 is replaced with a work function metal (WFM) layer and a gate metal layer 726.

P-type and N-type work metal materials are respectively added to form NMOS and PMOS devices prior to deposition of a gate metal. In some of the voids, N-type work function metal material (nWF) is deposited, while in other voids, P-type work function metal material (pWF) is deposited.

In some embodiments, the gate metal may be tungsten, while in other embodiments, the gate metal may be or cobalt or copper. Subsequently, a metal gate CMP process may be performed to polish the gate metal 726 to a predetermined height.

Upon depositing the gate metal 726, a self-aligned contact (SAC) cap formation process may be performed. SAC cap formation process may be comprised of recessing gate metal, deposition of a SAC cap dielectric material, and CMP of the SAC cap dielectric. This process results in a SAC cap being formed above the gate metal 726. In one embodiment, the SAC cap is formed by depositing silicon nitride using low-pressure chemical vapor deposition (LPCVD) to a thickness of from about 15 nm to about 80 nm, e.g., about 40 nm. In some embodiments, the cap layer may be utilized as a mask during subsequent processes, such as a TS metallization process.

FIG. 6 depicts the device 200 after performing the RMG and SAC processes. FIG. 6 shows a substrate 210 on which source drain fins, EPI features 230, and a gate region are formed. Within the gate region, the TS cut 220 is formed to form the TS region 240. The TS cut 220 comprises an oxide liner 237, a nitride liner 235 above a low-k spacer 212. The low-k spacer 212 is adjacent a silicon nitride layer 215. As noted above, the gate region also includes a WFM region 722, within which the tungsten layer 726 is formed. In one embodiment, the WFM region may be comprised of tungsten nitride. Silicon nitride regions 750 are formed above the WFM 722 and tungsten layer 726. At the bottom portion of the TS cut region 220, an oxide liner 242 encompasses an oxide layer 244, which was extended by the oxide layer 510 (FIG. 4-5). As a result of the extension of the oxide layer 244 to form the higher effective oxide layer, the presence of poly material residue or stringers are reduced or substantially eliminated.

Figure 7:
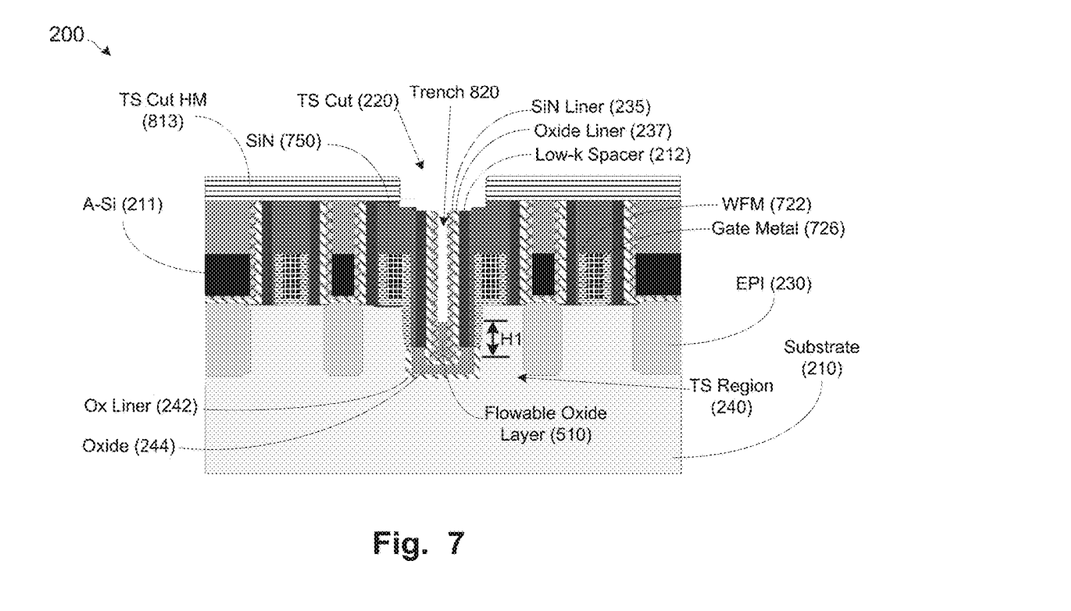
FIG. 7 illustrates a stylized cross-sectional view of the device, regarding a TS cut hardmask deposition process, in accordance with embodiments herein.

FIG. 7 illustrates a stylized cross-sectional view of the device 200, regarding a TS cut hardmask deposition process, in accordance with embodiments herein. A TS cut hardmask (HM) 813 is formed in the gate region, except for the TS cut region 220. The TS cut hardmask protects the fin and gate region when performing a TS lithography, as well as an oxide and a-Si etch process.

In one embodiment, the portion that is not protected by the TS cut HM 813 is removed by etch process (e.g., RIE process), thereby removing the oxide and a-Si portion in the trench of the TS region 220, leaving a trench 820. The trench 820 is lined by SiN liner 235, followed by the oxide liner 237, which lines the low-k spacer 212. Below the SiN liner 235, the flowable oxide layer 510 is at a height H1, from the bottom of the TS region 240.

Figure 8:
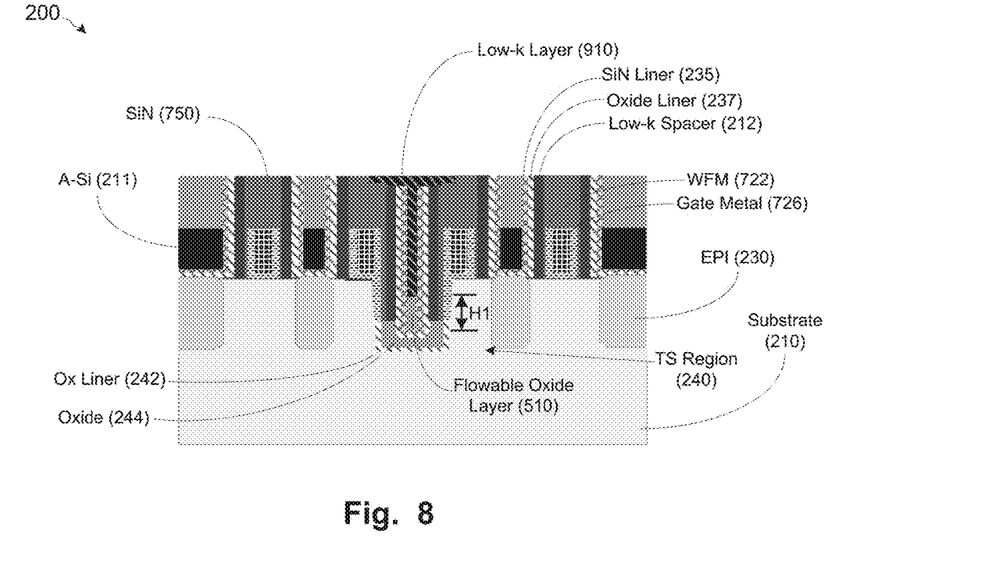
FIG. 8 illustrates a stylized cross-sectional view of the device, regarding a TS low-k material deposition process, in accordance with embodiments herein.

FIG. 8 illustrates a stylized cross-sectional view of the device 200, regarding a TS low-k material deposition process, in accordance with embodiments herein. After performing the TS lithography process and oxide and a-Si etch processes, the TS cut HM 813 are removed. A low-K material deposition process is performed to deposit low-K material into the trench 820 and into other areas that were not protected by the TS cut HM 813 of FIG. 8. This process provides a low-K layer 910.

The low-K layer 910 goes down to the top of the flowable oxide layer 510 and in between the SiN liners 235. After the low-K material is deposited, a CMP process may be performed to remove excess low-K material and bring the level of the low-K material to a predetermined height. The trench of the TS cut region 220 is filled with the SiN liner 235, the oxide liner 237, which lines the low-k spacer 212, the flowable oxide layer 510, and the low-K layer 910. That is, the trench of the TS cut region 220 comprises a liner set, which comprises the SiN liner 235, the oxide liner 237, and the low-k spacer 212. The space between the liner set in the trench is filled from the bottom of the trench to height H1 with an oxide layer. Further, above the oxide layer, the low-k layer 910 fills the space between the liner set, as well as the area above the PC/gate features in the gate region. Therefore, the opportunity for a residue or stringer to exist in the TS region 240 is reduced or substantially eliminated.

Figure 9:
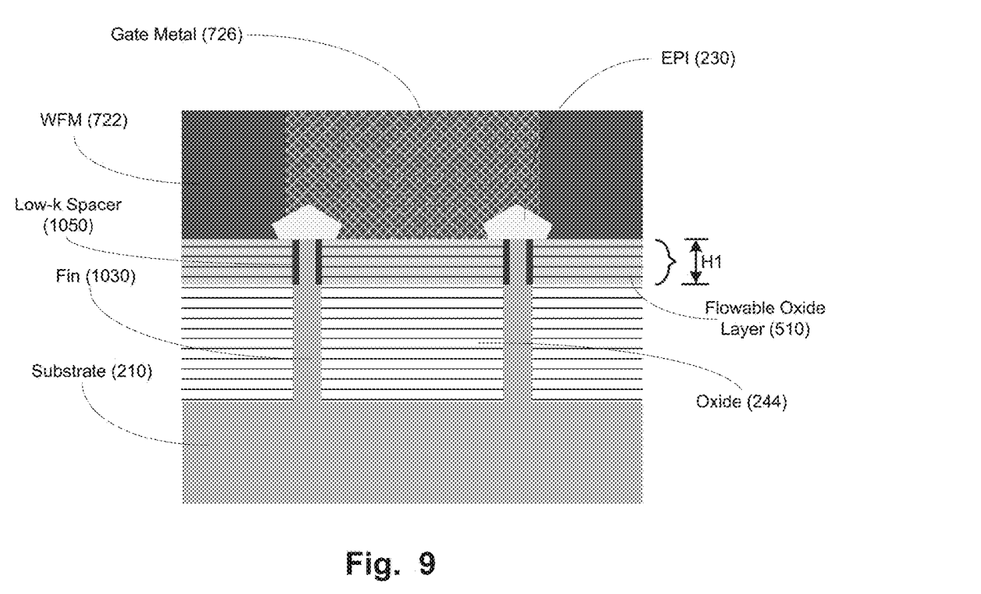
FIG. 9 illustrates a stylized depiction of the finFET device in a cross-sectional view that is perpendicular to the cross-sectional view of FIG. 9, in accordance with embodiments herein

FIG. 9 illustrates a stylized depiction of the finFET device 200 in a cross-sectional view that is perpendicular to the cross-sectional view of FIG. 8, in accordance with embodiments herein. The cross-sectional view of FIG. 9 shows a plurality of fins 1030, on which EPI features 230 are formed. FIG. 9 also depicts the gate metal 726 and the WFM layer 722. FIG. 9 generally exemplifies an STI region having two gate/PC double diffusion break.

Between the fins 1030, the original oxide layer 244 is depicted. Immediately above the layer 244, an additional layer of flowable oxide of a height, H1, was added during the flowable oxide process exemplified in FIGS. 3-4 and described above. The original oxide layer 244 and the additional flowable oxide layer of height H1 combine to form an effectively larger or higher oxide layer, bringing the total effective height of the oxide layer to a predetermined height capable of reducing and or substantially eliminating residue/stringers.

As depicted in FIG. 9, the additional layer of flowable oxide of height, H1, is adjacent a plurality of low-k spacers 1050. Due to the presence of the additional flowable oxide layer of height H1, potential current leakage, denoted by the arrows 1050, is reduced or substantially eliminated. Therefore, utilizing embodiments herein, the probability of leakage currents, and/or parasitic capacitances is reduced or substantially eliminated. Further processing known to those skilled in the art may be performed to complete forming the device 200.

Figure 10:
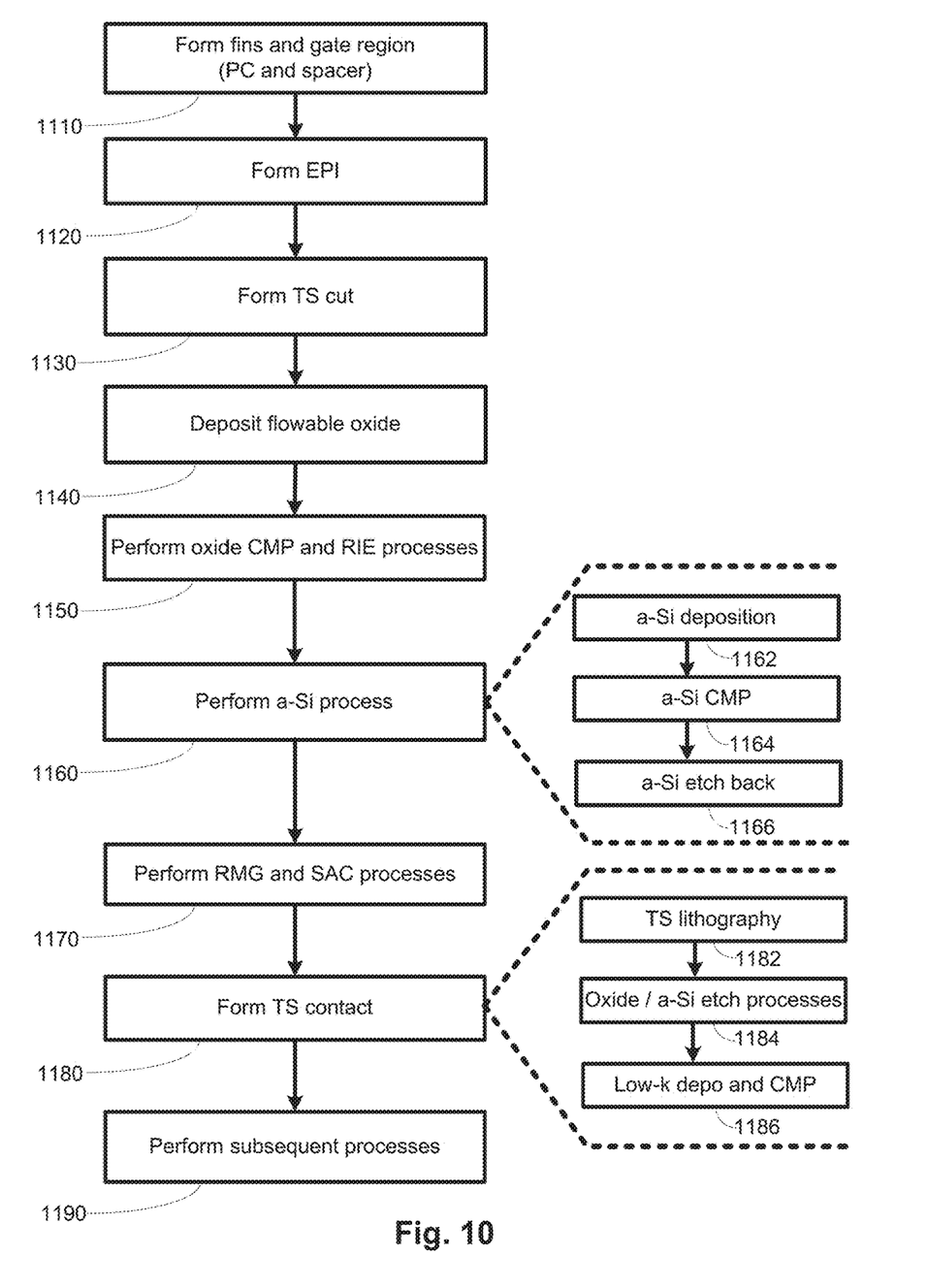
FIG. 10 illustrates a flowchart depiction of the method for forming a poly material residue, in accordance with embodiments herein.

Turning now to FIG. 10, a flowchart depiction of a method for manufacturing a device with reduced stringers, in accordance with embodiments herein. A plurality of fins, including PFET and NFET fins, as well as a gate region are formed on a substrate layer (at 1110). Those skilled in the art would appreciate that forming the gate region comprises various process steps, such as forming gate space region, poly gate region, nitride liner, low-k spacer, oxide liner, etc. (see for example, FIG. 2).

Further, using techniques know to those skilled in the art, EPI features may then be formed on the source/drain (S/D) regions (at 1120), as exemplified in FIG. 2. Further, a TS cut region is formed (at 1130). An STI fin cut process may be performed in order to form the TS cut region comprising a TS trench. The TS cut region may comprise an oxide liner, a nitride liner, and a low-k spacer. When forming the TS cut region, a hard mask layer may be deposited to protect S/D and gate regions.

A flowable oxide deposition process may be performed (at 1140), as exemplified in FIG. 3. In one embodiment, the flowable oxide is deposited between the components of the gate regions. The trench of the TS cut region, which may already comprise an oxide layer, receives a further layer of flowable oxide.

An oxide CMP and an oxide recess process (e.g., an RIE process) may be performed (at 1150), as exemplified in FIG. 4. This process generally removes the flowable oxide layer from the gate region and leaves a higher oxide layer in the trench of the TS region. This additional flowable oxide layer is capable of protecting the bottom portion of the trench from residue buildup that may have otherwise resulted from subsequent processes.

A set of a-Si processes may be performed (at 1160), as exemplified in FIG. 5. This process comprises performing an a-Si deposition process (at 1162), followed by an a-Si CMP (at 1164), and an a-Si etch back process (at 1166). Subsequently, an RMG and an SAC process are performed (at 1170), as exemplified in FIG. 6, forming that gate components of the finFET device.

A TS contact process may be formed (at 1180), as exemplified in FIGS. 7-8. This process may comprise performing a TS lithography process (at 1182) known to those skilled in the art. This process may comprise depositing a TS cut hard mask layer to protect the remaining portion of the device when processing the TS region. An oxide etch process and a-Si etch process may then be performed (at 1184). This process extracts a portion of an oxide layer and a portion of the a-Si layer down to a predetermined depth into the trench of the TS region (as exemplified in FIG. 7).

Subsequently, a low-k deposition process may be performed (at 1186), as exemplified in FIG. 8. This process deposits a low-k material into the trench above the oxide region. A CMP process is performed to bring the low-k layer to a desired level. Further processes for completing processing/manufacturing of the finFET device 200 may be performed. The process described in FIG. 10 results in a device comprising a trench region in which residue (e.g., poly material, a-Si residue) is reduced or substantially eliminated. Using principles described herein, those skilled in the art having benefit of the present disclosure would appreciate that the processes described in FIGS. 2-10 may be performed for PMOS devices and for NMOS devices. Further processing may be performed to complete forming the transistor device in accordance with embodiments herein.

Figure 11:
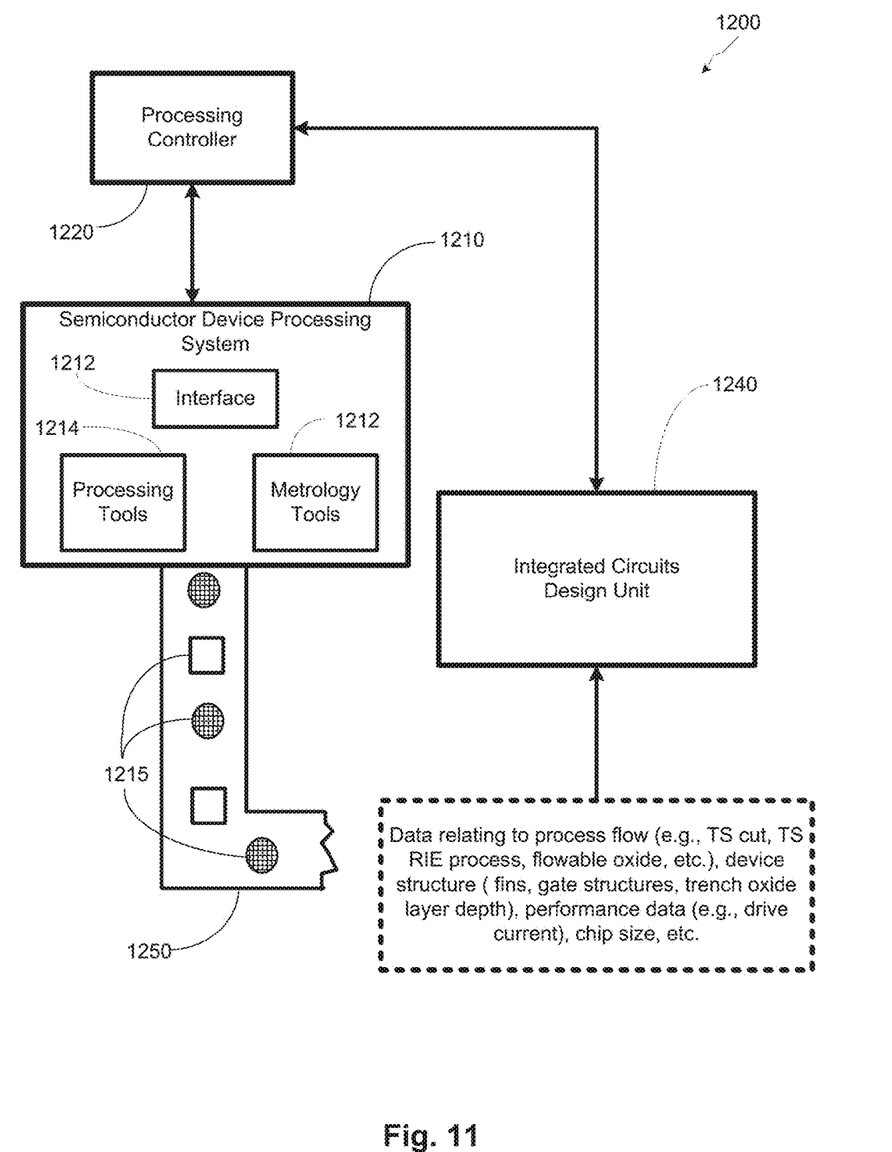
FIG. 11 illustrates a stylized depiction of a system for fabricating a semiconductor device comprising an integrated circuit, in accordance with embodiments herein.

Turning now to FIG. 11, a stylized depiction of a system for fabricating a semiconductor device comprising an integrated circuit, in accordance with embodiments herein, is illustrated. The system 1200 provides for forming a TS trench formation, depositing flowable oxide to provide an oxide layer of a predetermined height in the trench, and forming a device having reduced or substantially eliminated residue at the bottom portion of the trench.

The system 1200 of FIG. 11 may comprise a semiconductor device processing system 1210 and a design unit 1240. The semiconductor device processing system 1210 may manufacture integrated circuit devices based upon one or more designs provided by the design unit 124.

The semiconductor device processing system 1210 may comprise various processing stations, such as etch process stations, photolithography process stations, flowable oxide deposition process stations, CMP process stations, Epitaxy (EPI) process stations, etc. One or more of the processing steps performed by the processing system 1210 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1210 may produce integrated circuits on a medium, such as silicon wafers. More particularly, the semiconductor device processing system 1210 produce integrated circuits having finFET devices that comprise TS trench formations having reduced or substantially eliminated residue at the bottom portion of the trench, as described above.

The production of integrated circuits by the device processing system 1210 may be based upon the circuit designs provided by the integrated circuits design unit 1240. The processing system 1210 may provide processed integrated circuits/devices 1215 on a transport mechanism 1250, such as a conveyor system. In some embodiments, the conveyor system may be sophisticated clean room transport systems that are capable of transporting semiconductor wafers. In one embodiment, the semiconductor device processing system 1210 may comprise a plurality of processing steps to perform sigma recess regions, filling them with an REO material, and forming EPI features on the REO material, as described above.

In some embodiments, the items labeled "1215" may represent individual wafers, and in other embodiments, the items 1215 may represent a group of semiconductor wafers, e.g., a "lot" of semiconductor wafers. The integrated circuit or device 1215 may be a transistor, a capacitor, a resistor, a memory cell, a processor, and/or the like.

The integrated circuit design unit 1240 of the system 1200 is capable of providing a circuit design that may be manufactured by the semiconductor processing system 1210. The integrated circuit design unit 1240 may be capable of determining the number of devices (e.g., processors, memory devices, etc.) to place in a device package, type of EPI features, growth of the EPI features from the fin sidewalls, as well as from trench having additional flowable oxide to provide an oxide layer at the bottom of the trench to reduce or substantially eliminate undesirable residue as a result of other processes. The integrated circuit design unit 1240 may also determine the height of the fins, the size of the fin channels, etc. Based upon such details of the devices, the integrated circuit design unit 1240 may determine specifications of the finFETs that are to be manufactured. Based upon these specifications, the integrated circuit design unit 1240 may provide data for manufacturing a semiconductor device having the EPI features provided by embodiments herein.

The system 1200 may be capable of performing analysis and manufacturing of various products involving various technologies. For example, the system 1200 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A finFET device, comprising:
   a plurality of fins on a substrate;
   an epitaxial (EPI) region formed at a top portion of each fin of a first portion of the fins;
   a gate region formed on a second portion of the fins;
   a trench formed in a portion of the gate region, the trench comprising an oxide layer having a first height, wherein the first height is from the bottom of the trench up to a bottom portion of the EPI features, wherein the oxide layer is capable of substantially preventing a buildup of residue from a process step;
   a plurality of spacers on the walls of the trench, wherein a lower portion of the space between the spacers is filled with the oxide layer; and
   a low-k layer above the oxide layer in the trench and the gate region, wherein an upper portion of the space between the spacers is filled with the low-k layer, and the upper portion has a larger height than the lower portion.

2. The finFET device of claim 1, further comprising a plurality of low-k spacers each adjacent the fins in the first portion of fins, wherein an upper portion of the oxide layer is capable of reducing a current leakage flow through the low-k liners.

3. The finFET device of claim 1, wherein the upper portion of the oxide layer is formed from flowable oxide.

4. The finFET device of claim 1, wherein the trench is an shallow isolation trench (STI) trench comprising:
   a liner set comprising:
      a SiN liner, and
      an oxide liner adjacent the SiN liner; and wherein:
   the plurality of spacers are low-k spacers adjacent the SiN liner;
   wherein the oxide liner contacts the bottom portion of the trench up to the first height between the liner set; and
   the low-k layer is formed above the oxide liner between the liner set and between a first portion of the gate region and a second portion of the gate region.

5. The finFET device of claim 2, further comprising a metal formation at least partially above the EPI formations and at least partially above the oxide layer.

6. A finFET device, comprising:
   a plurality of fins on a semiconductor substrate;
   an epitaxial (EPI) region formed at a top portion of each fin of a first portion of the fins;
   a gate region formed on a second portion of the fins;
   a trench formed in a portion of the gate region, the trench comprising an oxide layer having a first height, wherein the first height is from the bottom of the trench up to a bottom portion of the EPI features, wherein the oxide layer is capable of substantially preventing a buildup of residue from a process step;
   an amorphous silicon (a-Si) layer disposed above the EPI region;
   a plurality of spacers on the walls of the trench, wherein a lower portion of the space between the spacers is filled with the oxide layer; and
   a low-k layer above the oxide layer in the trench and the gate region, wherein an upper portion of the space between the spacers is filled with the low-k layer, and the upper portion has a larger height than the lower portion.

7. The finFET device of claim 6, further comprising a plurality of low-k spacers each adjacent the fins in the first portion of fins, wherein an upper portion of the oxide layer is capable of reducing a current leakage flow through the low-k liners.

8. The finFET device of claim 6, wherein the upper portion of the oxide layer is formed from flowable oxide.

9. The finFET device of claim 6, wherein the trench is an shallow isolation trench (STI) trench comprising:
   a liner set comprising:
      a SiN liner, and
      an oxide liner adjacent the SiN liner; and wherein
   the plurality of spacers are low-k spacer spacers adjacent the SiN liner;
   wherein the oxide liner contacts the bottom portion of the trench up to the first height between the liner set; and
   the low-k layer is formed above the oxide liner between the liner set and between a first portion of the gate region and a second portion of the gate region.

10. The finFET device of claim 7, further comprising a metal formation at least partially above the EPI formations and at least partially above the oxide layer.

11. A finFET device, comprising:
    a first gate region and a second gate region each positioned on fins;
    an oxide stack positioned between the first gate region and the second gate region, the oxide stack comprising an oxide liner up to a first height, an oxide layer up to the first height, and a flowable oxide layer up to a second height about the first height; and
    a plurality of spacers extending from the first height up to essentially a top of the first gate region and the second gate region, wherein a bottom of each spacers is in physical contact with a top of the oxide layer.

12. The FinFET device of claim 11, further comprising:
    a low-k layer formed above the flowable oxide layer and between the plurality of spacers.

* * * * *